United States Patent
Lee

(10) Patent No.: US 11,348,803 B2
(45) Date of Patent: May 31, 2022

(54) FORMATION OF BOTTOM ISOLATION

(71) Applicant: Applied Materials, Inc., Santa Clara, CA (US)

(72) Inventor: Byeong Chan Lee, Pleasanton, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 16/850,265

(22) Filed: Apr. 16, 2020

(65) Prior Publication Data

US 2020/0373168 A1 Nov. 26, 2020

Related U.S. Application Data

(60) Provisional application No. 62/850,319, filed on May 20, 2019.

(51) Int. Cl.
*H01L 21/84* (2006.01)
*H01L 29/786* (2006.01)
(Continued)

(52) U.S. Cl.
CPC .. *H01L 21/31116* (2013.01); *H01L 21/02532* (2013.01); *H01L 21/02554* (2013.01);
(Continued)

(58) Field of Classification Search
CPC ............ H01L 29/0847; H01L 29/6653; H01L 29/42392; H01L 29/66439; B82Y 10/00
See application file for complete search history.

(56) References Cited

U.S. PATENT DOCUMENTS 9,984,936 B1 * 5/2018 Xie .................. B82Y 10/00
10,665,669 B1 * 5/2020 Xie .................. H01L 29/42392
(Continued)

FOREIGN PATENT DOCUMENTS

TW       2019-19108 A    5/2019
WO     2018-195428 A1   10/2018

OTHER PUBLICATIONS

International Search Report and Written Opinion dated Sep. 11, 2020 in International Patent Application No. PCT/US2020/028420, 8 pages.
(Continued)

*Primary Examiner* — Brian Turner
(74) *Attorney, Agent, or Firm* — Kilpatrick Townsend & Stockton LLP

(57) ABSTRACT

A method may include forming a plasma of a fluorine-containing precursor and contacting a semiconductor substrate with plasma effluents. The semiconductor substrate may include a layer of a first silicon-containing material having a first germanium content formed over the semiconductor substrate, and alternating layers of a second silicon-containing material and a third silicon-containing material over the layer of the first silicon-containing material. The third silicon-containing material may have a second germanium content. The method may further include laterally recessing the third silicon-containing material relative to the first and second silicon-containing materials. The method may further include depositing a spacer material adjacent to the third silicon-containing material relative to the first and second silicon-containing materials. The method may also include etching the first silicon-containing material relative to the second silicon-containing material and the spacer material.

12 Claims, 9 Drawing Sheets

(51) Int. Cl.
*H01L 29/423* (2006.01)
*H01L 29/45* (2006.01)
*H01L 27/088* (2006.01)
*H01L 21/8234* (2006.01)
*H01L 21/311* (2006.01)
*H01L 21/02* (2006.01)
*H01L 29/06* (2006.01)

(52) U.S. Cl.
CPC .... *H01L 21/02603* (2013.01); *H01L 29/0653* (2013.01); *H01L 29/0673* (2013.01)

(56) References Cited

U.S. PATENT DOCUMENTS

| | | | | |
|---|---|---|---|---|
| 2014/0312432 | A1* | 10/2014 | Ching | H01L 29/66795 257/401 |
| 2015/0364483 | A1* | 12/2015 | Koval | H01L 21/32133 438/257 |
| 2017/0104060 | A1* | 4/2017 | Balakrishnan | H01L 29/495 |
| 2017/0170294 | A1 | 6/2017 | Doris et al. | |
| 2018/0090624 | A1 | 3/2018 | Cheng et al. | |
| 2018/0175163 | A1 | 6/2018 | Barraud et al. | |
| 2018/0261686 | A1 | 9/2018 | Lin et al. | |
| 2018/0315665 | A1* | 11/2018 | Mosden | H01L 29/66795 |
| 2018/0337261 | A1 | 11/2018 | Bergendahl et al. | |
| 2019/0109040 | A1* | 4/2019 | Chao | H01L 29/6681 |
| 2019/0393304 | A1* | 12/2019 | Guillorn | H01L 21/0228 |
| 2020/0083219 | A1* | 3/2020 | Kang | H01L 21/3086 |
| 2020/0303500 | A1* | 9/2020 | Lou | H01L 29/785 |

OTHER PUBLICATIONS

International Preliminary Report on Patentability dated Dec. 2, 2021 in International Patent Application No. PCT/US2020/028420, 6 pages.

* cited by examiner

FORMATION OF BOTTOM ISOLATION

CROSS REFERENCES TO RELATED APPLICATIONS

This application claims the benefit of U.S. Provisional Patent Application No. 62/850,319 filed May 20, 2019, the contents of which are hereby incorporated by reference in their entirety for all purposes.

TECHNICAL FIELD

The present technology relates to semiconductor systems, processes, and equipment. More specifically, the present technology relates to systems and methods for selectively etching and depositing material layers on a semiconductor device.

BACKGROUND

Integrated circuits are made possible by processes which produce intricately patterned material layers on substrate surfaces. Producing patterned material on a substrate requires controlled methods for removal of exposed material. Chemical etching is used for a variety of purposes including transferring a pattern in photoresist into underlying layers, thinning layers, or thinning lateral dimensions of features already present on the surface. Often it is desirable to have an etch process that etches one material faster than another facilitating, for example, a pattern transfer process or individual material removal. Such an etch process is said to be selective to the first material. As a result of the diversity of materials, circuits, and processes, etch processes have been developed with a selectivity towards a variety of materials. Deposition processes, however, continue to be performed across substrates generally utilizing a blanket coat or a conformal fill.

As device sizes continue to shrink in next-generation devices, selectivity may play a larger role when only a few nanometers of material are formed in a particular layer, especially when the material is critical in the transistor formation. Many different etch process selectivities have been developed between various materials, although standard selectivities may no longer be suitable at current and future device scale. Additionally, queue times for processes continue to rise based on the number of masking, formation, and removal operations needed to form and protect the various critical dimensions of features across a device while patterning and formation are performed elsewhere on a substrate.

Thus, there is a need for improved systems and methods that can be used to produce high quality devices and structures. These and other needs are addressed by the present technology.

SUMMARY

According to some embodiments, a method of forming a semiconductor structure may include forming a plasma of a fluorine-containing precursor in a remote plasma region of a processing chamber. The method may further include contacting a semiconductor substrate with effluents of the plasma. The semiconductor substrate may be housed in a processing region of the processing chamber. The semiconductor substrate may include a layer of a first silicon-containing material having a first germanium content formed over the semiconductor substrate. The semiconductor substrate may further include alternating layers of a second silicon-containing material and a third silicon-containing material over the layer of the first silicon-containing material. The third silicon-containing material may have a second germanium content. The method may also include laterally recessing the layers of the third silicon-containing material. The layers of the third silicon-containing material may be selectively recessed relative to the layer of the first silicon-containing material and relative to the layers of the second silicon-containing material. The method may further include depositing a spacer material adjacent to the layers of the third silicon-containing material. The spacer material may be selectively deposited adjacent to the layers of the third silicon-containing material relative to exposed regions of the layer of the first silicon-containing material and relative to exposed regions of the layers of the second silicon-containing material. The method may also include etching the layer of the first silicon-containing material. The layer of the first silicon-containing material may be selectively etched relative to the layers of the second silicon-containing material and the spacer material.

In some embodiments, the first germanium content may be less than the second germanium content. A ratio of the second germanium content to the first germanium content may range between about 1:1 and about 100:1. In some embodiments, etching the layer of the first silicon-containing material may completely remove the layer of the first silicon-containing material between the semiconductor substrate and the alternating layers of the second silicon-containing material and the third silicon-containing material.

In some embodiments, the method may further include depositing an insulation material between the semiconductor substrate and the alternating layers of the second silicon-containing material and the third silicon-containing material. The insulation material may include an oxide material. In some embodiments, the method may also include etching the insulation material to form a bottom insulation layer between the layer of the first silicon-containing material and a bottom layer of the alternating layers of the second silicon-containing material and the third silicon-containing material. The bottom insulation layer may have a width no greater than a width of the bottom layer of the alternating layers. In some embodiments, the bottom insulation layer may have a width-to-thickness aspect ratio ranging between about 2:1 and 20:1. In some embodiments, the method may further include depositing a source or drain material over exposed surfaces of the semiconductor substrate. The source or drain material may be adjacent to the bottom insulation layer and the alternating layers of the second silicon-containing material and the third silicon-containing material.

In some embodiments, the method may be performed without conducting an ion implantation operation. In some embodiments, the first silicon-containing material may include silicon germanium, the second silicon-containing material may include silicon, and the third silicon-containing material may include silicon germanium.

In some embodiments, the method may further include removing the layers of the third silicon-containing material. The method may also include forming layers of a metal material, wherein the layers of the metal material and the layers of the second silicon-containing material may be arranged in an alternating manner. In some embodiments, the layers of the second silicon-containing material may be developed into a plurality of nanowire channels. In some embodiments, the layers of the metal material may be developed into a plurality of gates configured to control the plurality of nanowire channels.

In some embodiments, the semiconductor substrate may further include a plurality of gate formation structures each having an exposed cap material and an exposed dielectric material. The layers of the third silicon-containing material may be selectively recessed relative to the exposed cap material and the exposed dielectric material. The spacer material may be selectively deposited relative to the exposed cap material and the exposed dielectric material. The layer of the first silicon-containing material may be selectively etched relative to the exposed cap material and the exposed dielectric material.

According to some embodiments, a semiconductor structure may include a source, a drain, a plurality of nanowire channels between the source and the drain, and a bottom insulation layer. The plurality of nanowire channels may each have a width defined by the source and drain. The bottom insulation layer may contact a bottom nanowire channel of the plurality of nanowire channels and may be disposed between the source and drain. The bottom insulation layer may have a width no greater than the width of the bottom nanowire channel.

In some embodiments, the source, the drain, and the bottom insulation may be disposed over a silicon-containing substrate. In some embodiments, the source and the drain may be epitaxially grown over the silicon-containing substrate. In some embodiments, the bottom insulation layer may have a width-to-thickness aspect ratio ranging between about 2:1 and 20:1. In some embodiments, the bottom insulation layer may include an oxide material. In some embodiments, the semiconductor structure may further include a plurality of gate structures. The plurality of gate structures may be each disposed around a nanowire channel of at least some of the plurality of nanowire channels.

The technology described herein may provide numerous benefits over conventional systems and techniques. For example, the technology described herein may form a bottom insulation layer for effective current leakage prevention without hindering or interfering with subsequent source or drain formation, and the source or drain subsequently formed may have limited defects or be without defects. These and other embodiments, along with many of their advantages and features, are described in more detail in conjunction with the below description and attached figures.

BRIEF DESCRIPTION OF THE DRAWINGS

A further understanding of the nature and advantages of the disclosed technology may be realized by reference to the remaining portions of the specification and the drawings.

Figure 1:
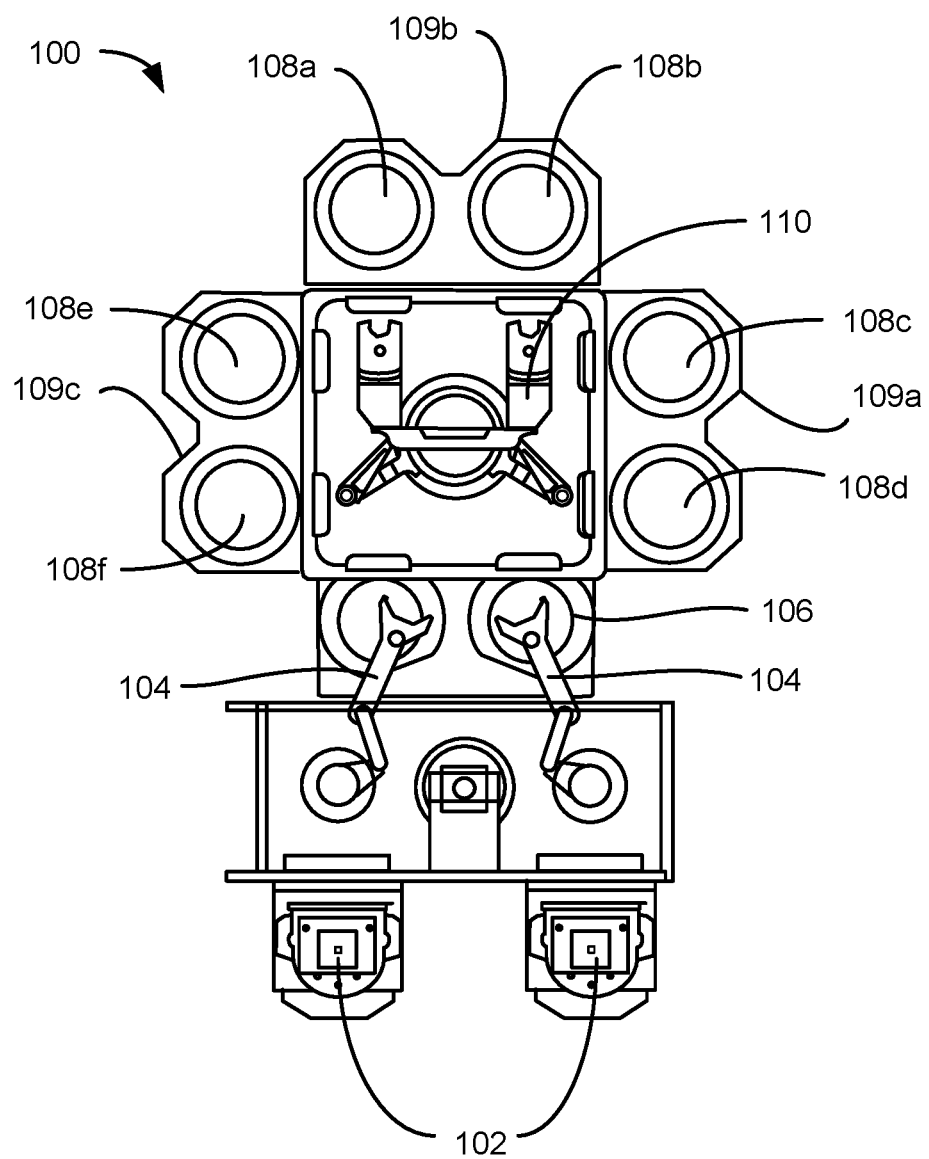
FIG. 1 shows a top plan view of an exemplary processing system according to embodiments of the present technology.

Several of the figures are included as schematics. It is to be understood that the figures are for illustrative purposes, and are not to be considered of scale unless specifically stated to be of scale. Additionally, as schematics, the figures are provided to aid comprehension and may not include all aspects or information compared to realistic representations, and may include exaggerated material for illustrative purposes.

In the appended figures, similar components and/or features may have the same reference label. Further, various components of the same type may be distinguished by following the reference label by a letter that distinguishes among the similar components. If only the first reference label is used in the specification, the description is applicable to any one of the similar components having the same first reference label irrespective of the letter.

DETAILED DESCRIPTION

The present technology includes systems and methods for semiconductor processing of small pitch features. In gate-all-around and other transistor structures, a gate structure may not be formed all around a bottom channel, such as a bottom nanowire channel, and current leakage may occur through the bottom nanowire channel. To limit the current leakage, a bottom insulation layer may be formed. The bottom insulation layer formed by conventional technologies typically extends into regions where the source and drain coupled with the bottom insulation layer are subsequently formed. There are several drawbacks associated with such bottom insulation layer formation. Specifically, formation of the source or drain is typically performed by epitaxially growing a source or drain material, such as a semiconductor material, over a surface. When the bottom insulation layer, which is typically an insulative oxide material, extends into the source and drain regions, the epitaxial growth of the semiconductor source or drain material over the insulative oxide bottom insulation layer can be challenging.

Additionally, one or more reactive-ion etching (RIE) operations and/or ion implantation operations may be performed when forming the bottom isolation layer in conventional technologies. The RIE and/or ion implantation operations may cause damage or defects in the features or components of the transistors to be formed. For example, the RIE and/or ion implantation operations may cause damage to the surface on which the source or drain material may be epitaxially grown, and such damage may in turn cause defects in the source or drain subsequently formed, affecting the perform of the transistor device produced.

The present technology overcomes these issues by developing selective etching and selective deposition processes for removal and formation, and may not utilize any RIE and/or ion implantation processes when forming the bottom isolation layer. By utilizing selective etching processes performed in particular equipment and deposition operations in particular equipment, the processes described may form a bottom insulation layer that may not extend into the source or drain regions. The bottom insulation layer formed by the processes described herein may provide effective current leakage control without hindering or interfering with subsequent source or drain formation. Further, damage to the substrate on which the source or drain material may be epitaxially grown may be reduced or avoided, and defect-less sources and drains may be formed.

Although the remaining disclosure will routinely identify specific etching and deposition processes utilizing the disclosed technology, it will be readily understood that the systems and methods are equally applicable to a variety of other etching, deposition, and cleaning processes as may occur in the described chambers. Accordingly, the technology should not be considered to be so limited as for use with the described etching and deposition processes alone. The disclosure will discuss one possible system and chambers that can be used with the present technology to perform certain of the removal and deposition operations before describing operations of an exemplary process sequence according to the present technology.

FIG. 1 shows a top plan view of one embodiment of a processing system 100 of deposition, etching, baking, and curing chambers according to embodiments. In the figure, a pair of front opening unified pods (FOUPs) 102 supply substrates of a variety of sizes that are received by robotic arms 104 and placed into a low pressure holding area 106 before being placed into one of the substrate processing chambers 108a-f, positioned in tandem sections 109a-c. A second robotic arm 110 may be used to transport the substrate wafers from the holding area 106 to the substrate processing chambers 108a-f and back. Each substrate processing chamber 108a-f, can be outfitted to perform a number of substrate processing operations including the dry etch processes and selective deposition described herein in addition to cyclical layer deposition (CLD), atomic layer deposition (ALD), chemical vapor deposition (CVD), physical vapor deposition (PVD), wet etch, pre-clean, degas, orientation, and other substrate processes.

The substrate processing chambers 108a-f may include one or more system components for depositing, annealing, curing and/or etching a dielectric film on the substrate wafer. In one configuration, two pairs of the processing chambers, e.g., 108c-d and 108e-f, may be used to deposit dielectric material or metal-containing material on the substrate, and the third pair of processing chambers, e.g., 108a-b, may be used to etch the deposited dielectric. In another configuration, all three pairs of chambers, e.g., 108a-f, may be configured to etch a dielectric film on the substrate. Any one or more of the processes described may be carried out in chamber(s) separated from the fabrication system shown in different embodiments.

In some embodiments the chambers specifically include at least one etching chamber as well as at least one deposition chamber. By including these chambers in combination on the processing side of the factory interface, all etching and deposition processes discussed below may be performed in a controlled environment. For example, a vacuum environment may be maintained on the processing side of holding area 106, so that all chambers and transfers are maintained under vacuum in embodiments. This may also limit water vapor and other air components from contacting the substrates being processed. It will be appreciated that additional configurations of deposition, etching, annealing, and curing chambers for dielectric films are contemplated by system 100.

Figure 2:
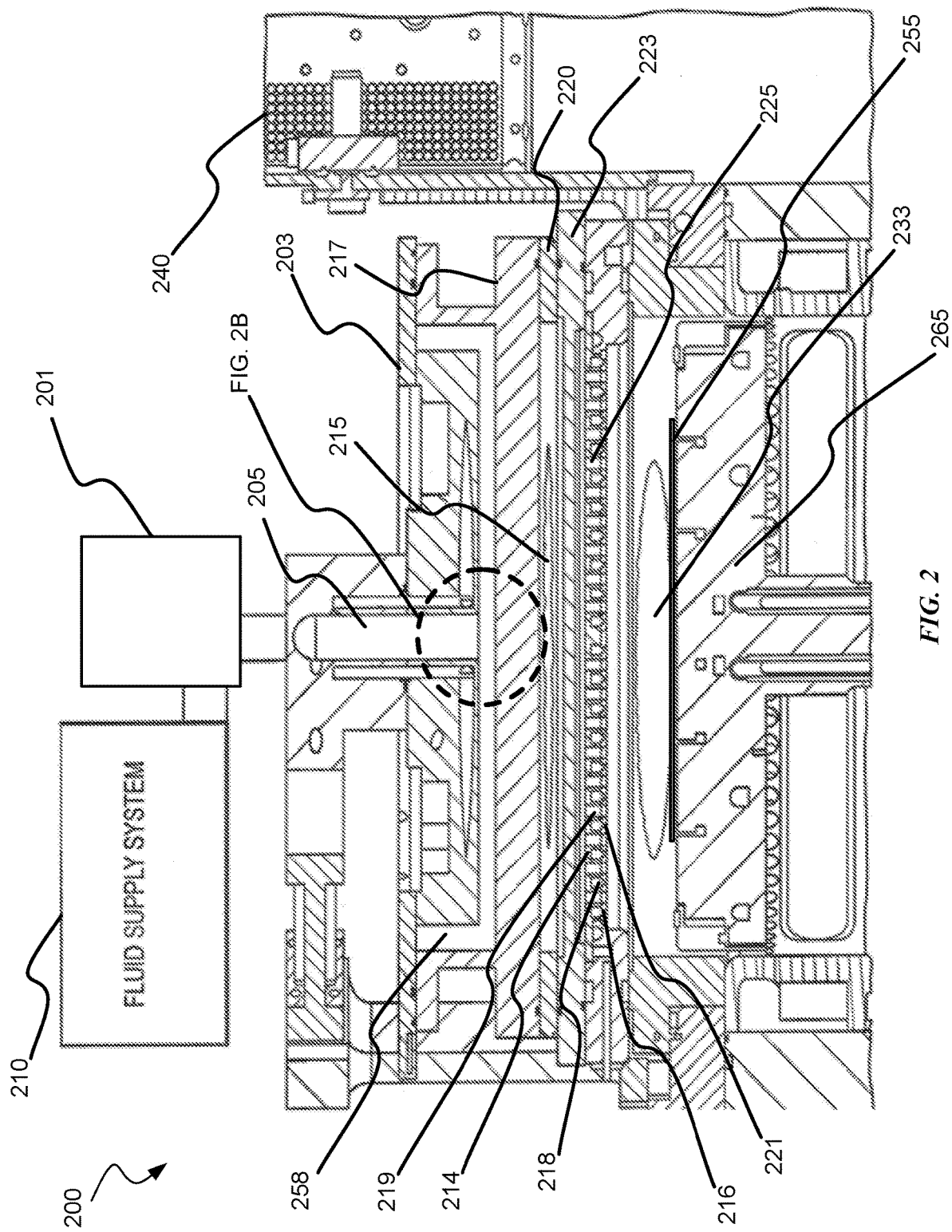
FIG. 2 shows a schematic cross-sectional view of an exemplary processing chamber according to embodiments of the present technology.

FIG. 2 shows a cross-sectional view of an exemplary process chamber system 200 with partitioned plasma generation regions within the processing chamber. During film etching, e.g., titanium nitride, tantalum nitride, tungsten, cobalt, aluminum oxide, tungsten oxide, silicon, polysilicon, silicon oxide, silicon nitride, silicon oxynitride, silicon oxycarbide, etc., a process gas may be flowed into the first plasma region 215 through a gas inlet assembly 205. A remote plasma system (RPS) 201 may optionally be included in the system, and may process a first gas which then travels through gas inlet assembly 205. The inlet assembly 205 may include two or more distinct gas supply channels where the second channel (not shown) may bypass the RPS 201, if included.

A cooling plate 203, faceplate 217, ion suppressor 223, showerhead 225, and a substrate support 265, having a substrate 255 disposed thereon, are shown and may each be included according to embodiments. The pedestal 265 may have a heat exchange channel through which a heat exchange fluid flows to control the temperature of the substrate, which may be operated to heat and/or cool the substrate or wafer during processing operations. The wafer support platter of the pedestal 265, which may comprise aluminum, ceramic, or a combination thereof, may also be resistively heated in order to achieve relatively high temperatures, such as from up to or about 100° C. to above or about 1100° C., using an embedded resistive heater element.

The faceplate 217 may be pyramidal, conical, or of another similar structure with a narrow top portion expanding to a wide bottom portion. The faceplate 217 may additionally be flat as shown and include a plurality of through-channels used to distribute process gases. Plasma generating gases and/or plasma excited species, depending on use of the RPS 201, may pass through a plurality of holes, shown in FIG. 3, in faceplate 217 for a more uniform delivery into the first plasma region 215.

Exemplary configurations may include having the gas inlet assembly 205 open into a gas supply region 258 partitioned from the first plasma region 215 by faceplate 217 so that the gases/species flow through the holes in the faceplate 217 into the first plasma region 215. Structural and operational features may be selected to prevent significant backflow of plasma from the first plasma region 215 back into the supply region 258, gas inlet assembly 205, and fluid supply system 210. The faceplate 217, or a conductive top portion of the chamber, and showerhead 225 are shown with an insulating ring 220 located between the features, which allows an AC potential to be applied to the faceplate 217 relative to showerhead 225 and/or ion suppressor 223. The insulating ring 220 may be positioned between the faceplate 217 and the showerhead 225 and/or ion suppressor 223 enabling a capacitively coupled plasma (CCP) to be formed in the first plasma region. A baffle (not shown) may additionally be located in the first plasma region 215, or otherwise coupled with gas inlet assembly 205, to affect the flow of fluid into the region through gas inlet assembly 205.

The ion suppressor 223 may comprise a plate or other geometry that defines a plurality of apertures throughout the structure that are configured to suppress the migration of ionically-charged species out of the first plasma region 215 while allowing uncharged neutral or radical species to pass through the ion suppressor 223 into an activated gas delivery region between the suppressor and the showerhead. In embodiments, the ion suppressor 223 may comprise a perforated plate with a variety of aperture configurations. These uncharged species may include highly reactive species that are transported with less reactive carrier gas through the apertures. As noted above, the migration of ionic species through the holes may be reduced, and in some instances completely suppressed. Controlling the amount of ionic species passing through the ion suppressor 223 may advantageously provide increased control over the gas mixture brought into contact with the underlying wafer substrate, which in turn may increase control of the deposition and/or etch characteristics of the gas mixture. For example, adjustments in the ion concentration of the gas mixture can significantly alter its etch selectivity, e.g., SiNx:SiOx etch ratios, Si:SiOx etch ratios, etc. In alternative embodiments in which deposition is performed, it can also shift the balance of conformal-to-flowable style depositions for dielectric materials.

The plurality of apertures in the ion suppressor 223 may be configured to control the passage of the activated gas, i.e., the ionic, radical, and/or neutral species, through the ion suppressor 223. For example, the aspect ratio of the holes, or the hole diameter to length, and/or the geometry of the holes may be controlled so that the flow of ionically-charged species in the activated gas passing through the ion suppressor 223 is reduced. The holes in the ion suppressor 223 may include a tapered portion that faces the plasma excitation region 215, and a cylindrical portion that faces the showerhead 225. The cylindrical portion may be shaped and dimensioned to control the flow of ionic species passing to the showerhead 225. An adjustable electrical bias may also be applied to the ion suppressor 223 as an additional means to control the flow of ionic species through the suppressor.

The ion suppressor 223 may function to reduce or eliminate the amount of ionically charged species traveling from the plasma generation region to the substrate. Uncharged neutral and radical species may still pass through the openings in the ion suppressor to react with the substrate. It should be noted that the complete elimination of ionically charged species in the reaction region surrounding the substrate may not be performed in embodiments. In certain instances, ionic species are intended to reach the substrate in order to perform the etch and/or deposition process. In these instances, the ion suppressor may help to control the concentration of ionic species in the reaction region at a level that assists the process.

Showerhead 225 in combination with ion suppressor 223 may allow a plasma present in first plasma region 215 to avoid directly exciting gases in substrate processing region 233, while still allowing excited species to travel from chamber plasma region 215 into substrate processing region 233. In this way, the chamber may be configured to prevent the plasma from contacting a substrate 255 being etched. This may advantageously protect a variety of intricate structures and films patterned on the substrate, which may be damaged, dislocated, or otherwise warped if directly contacted by a generated plasma. Additionally, when plasma is allowed to contact the substrate or approach the substrate level, the rate at which oxide species etch may increase. Accordingly, if an exposed region of material is oxide, this material may be further protected by maintaining the plasma remotely from the substrate.

The processing system may further include a power supply 240 electrically coupled with the processing chamber to provide electric power to the faceplate 217, ion suppressor 223, showerhead 225, and/or pedestal 265 to generate a plasma in the first plasma region 215 or processing region 233. The power supply may be configured to deliver an adjustable amount of power to the chamber depending on the process performed. Such a configuration may allow for a tunable plasma to be used in the processes being performed. Unlike a remote plasma unit, which is often presented with on or off functionality, a tunable plasma may be configured to deliver a specific amount of power to the plasma region 215. This in turn may allow development of particular plasma characteristics such that precursors may be dissociated in specific ways to enhance the etching profiles produced by these precursors.

A plasma may be ignited either in chamber plasma region 215 above showerhead 225 or substrate processing region 233 below showerhead 225. In embodiments, the plasma formed in substrate processing region 233 may be a DC biased plasma formed with the pedestal acting as an electrode. Plasma may be present in chamber plasma region 215 to produce the radical precursors from an inflow of, for example, a fluorine-containing precursor or other precursor. An AC voltage typically in the radio frequency (RF) range may be applied between the conductive top portion of the processing chamber, such as faceplate 217, and showerhead 225 and/or ion suppressor 223 to ignite a plasma in chamber plasma region 215 during deposition. An RF power supply may generate a high RF frequency of 13.56 MHz but may also generate other frequencies alone or in combination with the 13.56 MHz frequency.

Figure 3:
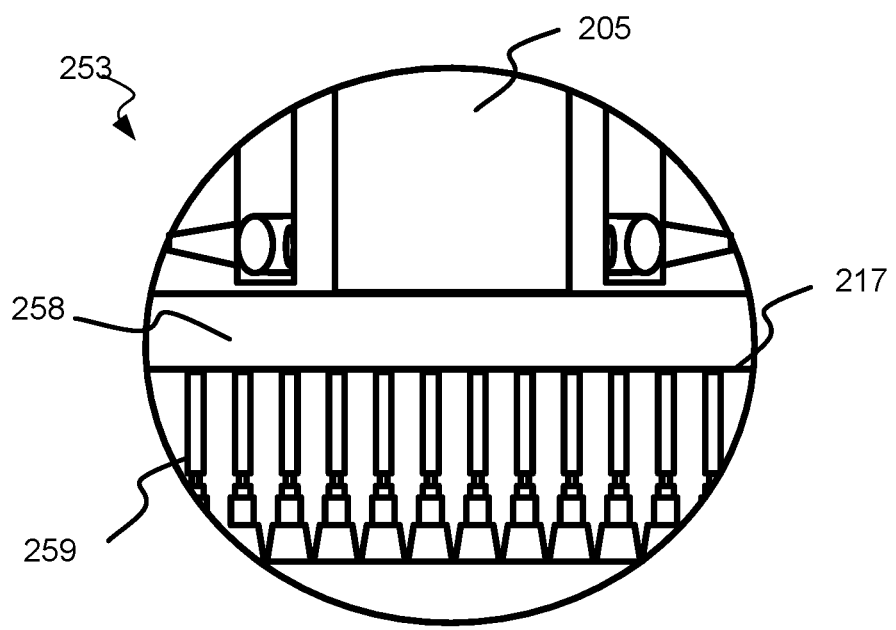
FIG. 3 shows a detailed view of an exemplary showerhead according to embodiments of the present technology.

FIG. 3 shows a detailed view 253 of the features affecting the processing gas distribution through faceplate 217. As shown in FIGS. 2 and 3, faceplate 217, cooling plate 203, and gas inlet assembly 205 intersect to define a gas supply region 258 into which process gases may be delivered from gas inlet 205. The gases may fill the gas supply region 258 and flow to first plasma region 215 through apertures 259 in faceplate 217. The apertures 259 may be configured to direct flow in a substantially unidirectional manner such that process gases may flow into processing region 233, but may be partially or fully prevented from backflow into the gas supply region 258 after traversing the faceplate 217.

The gas distribution assemblies such as showerhead 225 for use in the processing chamber section 200 may be referred to as dual channel showerheads (DCSH) and are additionally detailed in the embodiments described in FIG. 3. The dual channel showerhead may provide for etching processes that allow for separation of etchants outside of the processing region 233 to provide limited interaction with chamber components and each other prior to being delivered into the processing region.

The showerhead 225 may comprise an upper plate 214 and a lower plate 216. The plates may be coupled with one another to define a volume 218 between the plates. The coupling of the plates may be so as to provide first fluid channels 219 through the upper and lower plates, and second fluid channels 221 through the lower plate 216. The formed channels may be configured to provide fluid access from the volume 218 through the lower plate 216 via second fluid channels 221 alone, and the first fluid channels 219 may be fluidly isolated from the volume 218 between the plates and the second fluid channels 221. The volume 218 may be fluidly accessible through a side of the gas distribution assembly 225.

Figure 4:
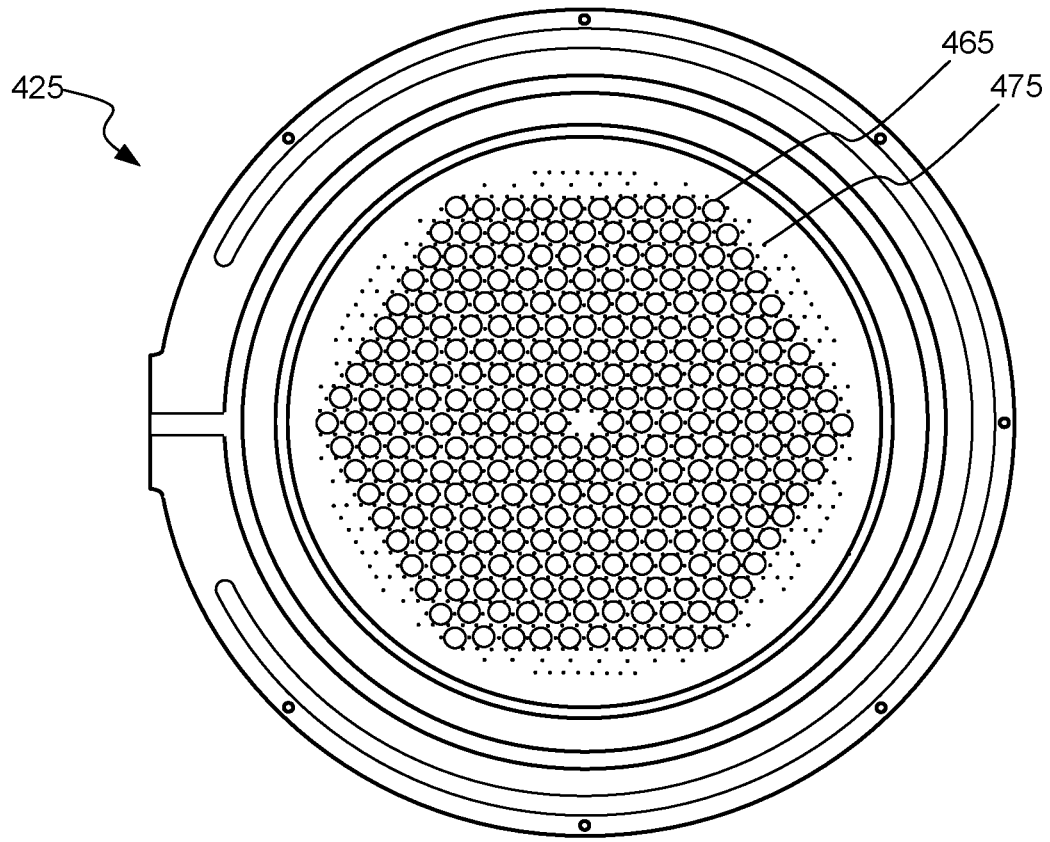
FIG. 4 shows a bottom plan view of an exemplary showerhead according to embodiments of the present technology.

FIG. 4 is a bottom view of a showerhead 425 for use with a processing chamber according to embodiments. Showerhead 425 may correspond with the showerhead 225 shown in FIG. 2. Through-holes 465, which show a view of first fluid channels 219, may have a plurality of shapes and configurations in order to control and affect the flow of precursors through the showerhead 225. Small holes 475, which show a view of second fluid channels 221, may be distributed substantially evenly over the surface of the showerhead, even amongst the through-holes 465, and may help to provide more even mixing of the precursors as they exit the showerhead than other configurations.

Figure 5:
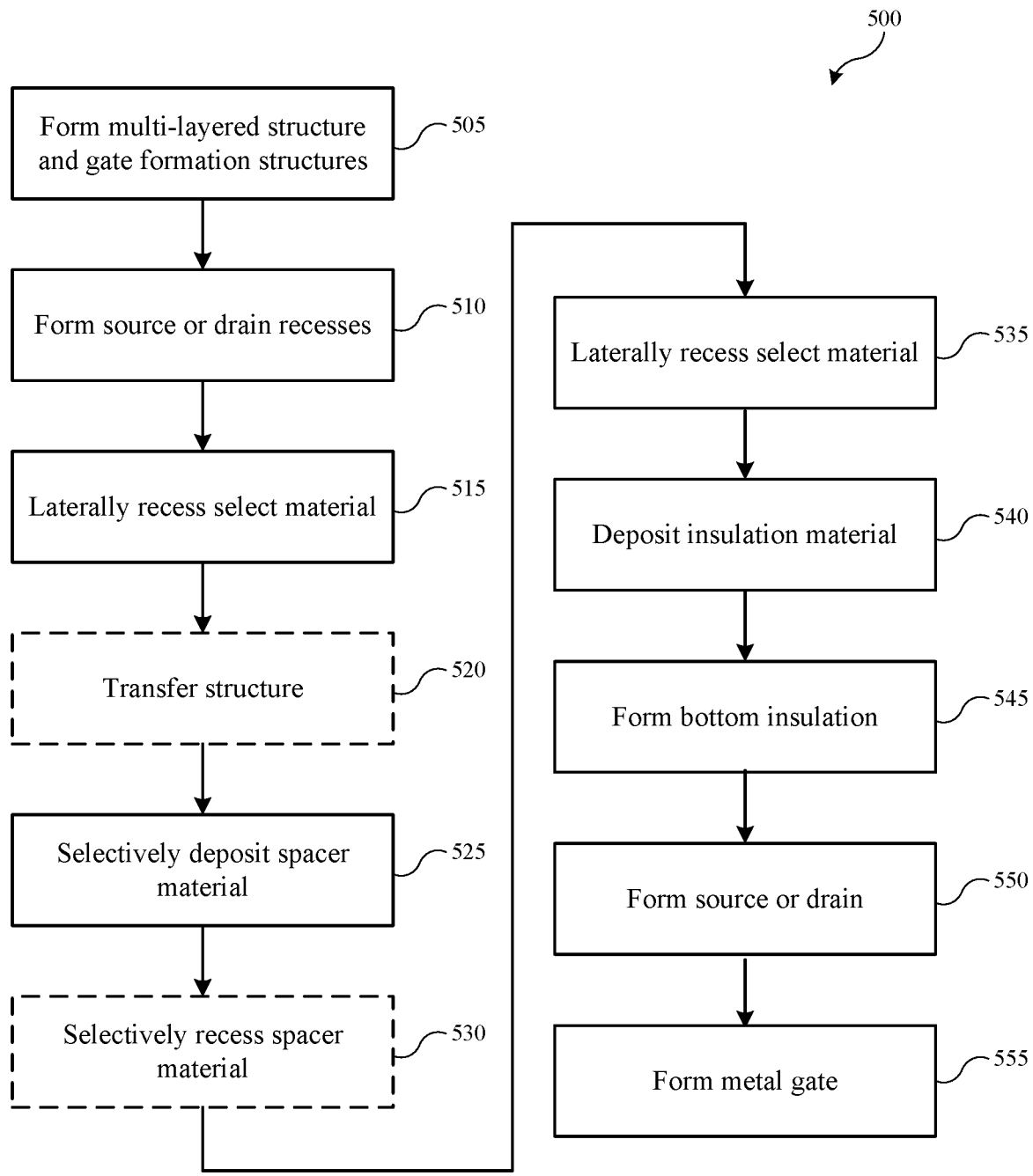
FIG. 5 shows selected operations in a method of forming a semiconductor structure according to embodiments of the present technology.

FIG. 5 illustrates a method 500 of forming a semiconductor structure, many operations of which may be performed, for example, in the chamber 200 as previously described. Method 500 may include one or more operations prior to the initiation of the method, including front end processing, polishing, cleaning, deposition, etching, or any other operations that may be performed prior to the described operations. The method may include a number of optional operations as denoted in the figure, which may or may not be specifically associated with the method according to the present technology. For example, many of the operations are described in order to provide a broader scope of the structural formation, but are not critical to the technology, or may be performed by alternative methodology as will be discussed further below. Method 500 describes the operations shown schematically in FIGS. 6A-6J, the illustrations of which will be described in conjunction with the operations of method 500. It is to be understood that FIG. 6 illustrates only partial schematic views, and a substrate may contain any number of transistor sections having aspects as illustrated in the figures. The operations of method 500 may be performed to form a bottom insulation layer to prevent current leakage through a bottom nanowire channel. The operations of method 500 may also be performed to limit or eliminate RIE and/or ion implantation processes, and to prevent damage to silicon-containing surfaces for defect-less source or drain formation. The operations of method 500 may be further performed to limit or eliminate masking operations and/or RIE processes, and to reduce process queue times.

Figure 6A:
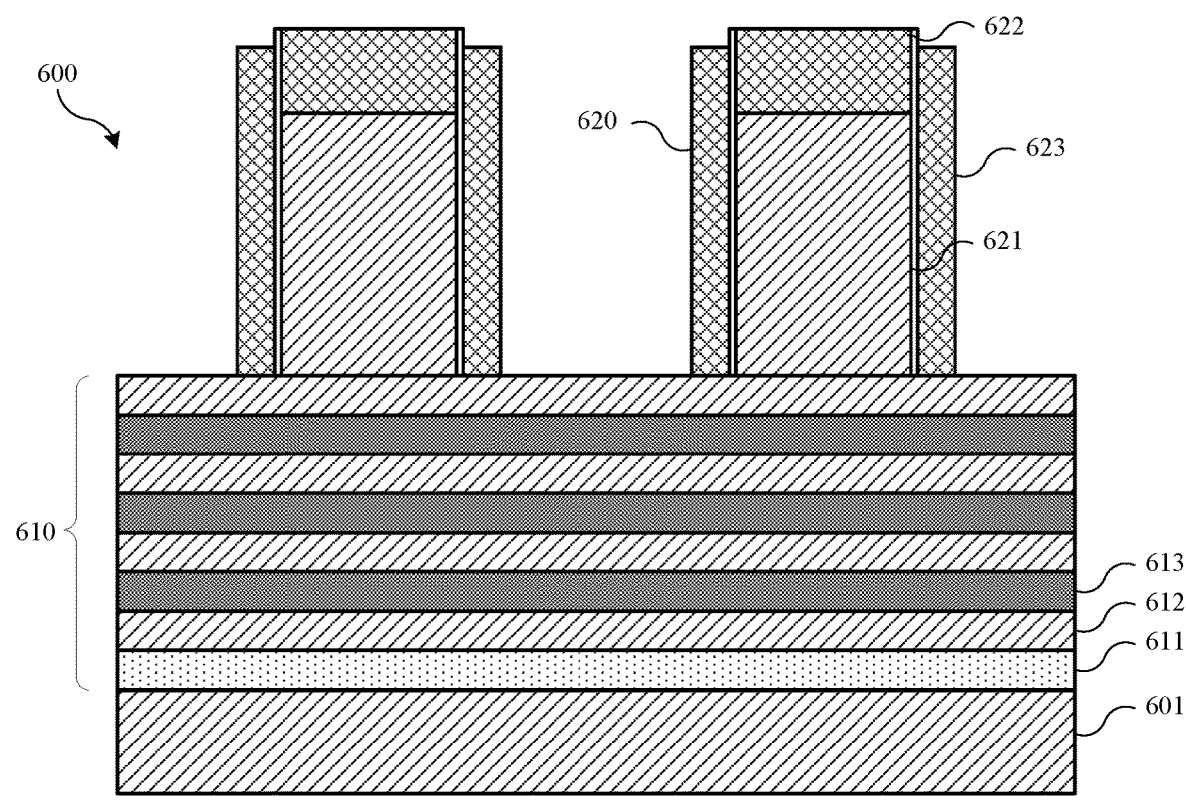
FIGS. 6A-6J show schematic cross-sectional views of exemplary substrates according to embodiments of the present technology.

As illustrated in FIG. 6A, method 500 may begin at operation 505 by forming a multi-layered structure 610 over a substrate 601 and one or more gate formation structures 620 over the multi-layered structure 610. The substrate 601 may be made of or contain silicon or some other semiconductor substrate material. The multi-layered structure 610 may include layers of different silicon-containing materials. As will be discussed in more detail below, the multi-layered structure 610 may be subsequently developed into various transistor structures, e.g., nanowire channels, gates, etc.

The gate formation structures 620 may each include a dummy gate material 621, which may be subsequently removed to produce a metal gate. Additionally, the gate formation structures 620 may each further have a cap material 622 formed overlying the dummy gate 621, and a dielectric material 623 formed about the dummy gate 621. The dielectric material 623 may be blanketed over the structure and then patterned into the structure illustrated, or the dielectric material 623 may be selectively deposited about the cap material 622 and dummy gate 621. Only two gate formation structures 620 are shown in FIG. 6 for the purpose of illustration. More than two gate formation structures 620 and/or other transistors structures may be formed overlaying the multi-layered structure 610. In some embodiments, the dummy gate material 621 may be polysilicon or a silicon-containing material. The cap material 622 may be a dielectric material, and may include silicon-containing material, an oxygen-containing material, a carbon-containing material, or some combination of these materials, such as silicon oxide or silicon nitride. The dielectric material 623 may include an insulative material, and may include a silicon-containing material, an oxygen-containing material, a carbon-containing material, or some combination of these materials, such as silicon oxide or silicon nitride. In embodiments the cap material 622 and the dielectric material 623 may be the same material or may be different materials. For example, in one embodiment the cap material 622 may be or include silicon nitride, and the dielectric material 623 may be or include silicon oxide.

The multi-layered structure 610 may include a layer of a first silicon-containing material 611 over the substrate 601, and alternating layers of a second silicon-containing material 612 and a third silicon-containing material 613 over the layer of the first silicon-containing material 611. Although FIG. 6A illustrates four layers of the second silicon-containing material 612 and three layers of the third silicon-containing material 613, it will be readily appreciated that there may be more or less layers of the second or third silicon-containing material 612, 613.

The first silicon-containing material 611 may be or include silicon germanium having a first germanium content. The second silicon-containing material 612 may be or include the same material as the substrate material 601, and thus may be or include silicon. The third silicon-containing material 613 may be or include silicon germanium having a second germanium content. The first germanium content may be less than the second germanium content. A ratio of the second germanium content to the first germanium content may range between 1:1 and about 100:1, between about 20:1 and about 100:1, between about 40:1 and about 100:1, between about 60:1 and about 100:1, between about 80:1 and about 100:1, between about 1:1 and about 80:1, between about 20:1 and about 80:1, between about 40:1 and about 80:1, between about 60:1 and about 80:1, between about 1:1 and about 60:1, between about 20:1 and about 60:1, between about 40:1 and about 60:1, between about 1:1 and about 40:1, between about 20:1 and about 40:1, or between about 1:1 and about 20:1 in various embodiments. The ratio of the second germanium content to the first germanium content may be greater than 1:1, greater than or about 5:1, greater than or about 10:1, greater than or about 20:1, greater than or about 30:1, greater than or about 40:1, greater than or about 50:1, greater than or about 60:1, greater than or about 70:1, greater than or about 80:1, greater than or about 90:1, greater than or about 100:1, or greater in various embodiments. The first, second, and/or third silicon-containing materials 611, 612, 613 may be formed using any layer formation, deposition, or growth techniques, such as epitaxial growth.

The first silicon-containing material 611 may have a thickness ranging between about 5 nm and about 25 nm or between about 10 nm and about 20 nm in embodiments. The thickness of the first silicon-containing material 611 may be greater than or about 5 nm or greater than or about 10 nm, and may be less than or about 25 nm or less than or about 20 nm in various embodiments. Depending on the dimensions of the other components of the transistor structure, a ratio of the thickness of the first silicon-containing material 611 to a thickness of each layer of the second silicon-containing material 612 may range between 4:1 and about 1:5 in embodiments, and may range between about 4:1 and 1:4, between about 3:1 and 1:3, or between about 2:1 and 1:2. A ratio of the thickness of the first silicon-containing material 611 to a thickness of each layer of the third silicon-containing material 613 may range between 4:1 and about 1:5 in embodiments, and may range between about 4:1 and 1:4, between about 3:1 and 1:3, or between about 2:1 and 1:2. As will be discussed in more detail below, the thickness of the first silicon-containing material 611 may be selected to facilitate the formation of a bottom insulation layer and to achieve desired insulation functions of the bottom insulation layer.

Depending on the second silicon-containing material 612 and the third silicon-containing material 613, the structure 600 illustrated may include a P-MOS region and may be associated with an N-MOS region (not illustrated) in some embodiments, while in other embodiments, the structure 600 may include an N-MOS region and may be associated with a P-MOS region (not illustrated). Several of the operations discussed below may be performed on one region of the structure while the other region remains masked, or may be performed selectively without masking. If masking is used over the two regions, the masking may then be switched with a removal and re-formation, and then similar operations may be performed on the other region, which may be selective within the exposed region. These operations will be described further below, although it is to be understood that either region may be processed before the other region, and the methods are not limited by the examples described.

Figure 6B:
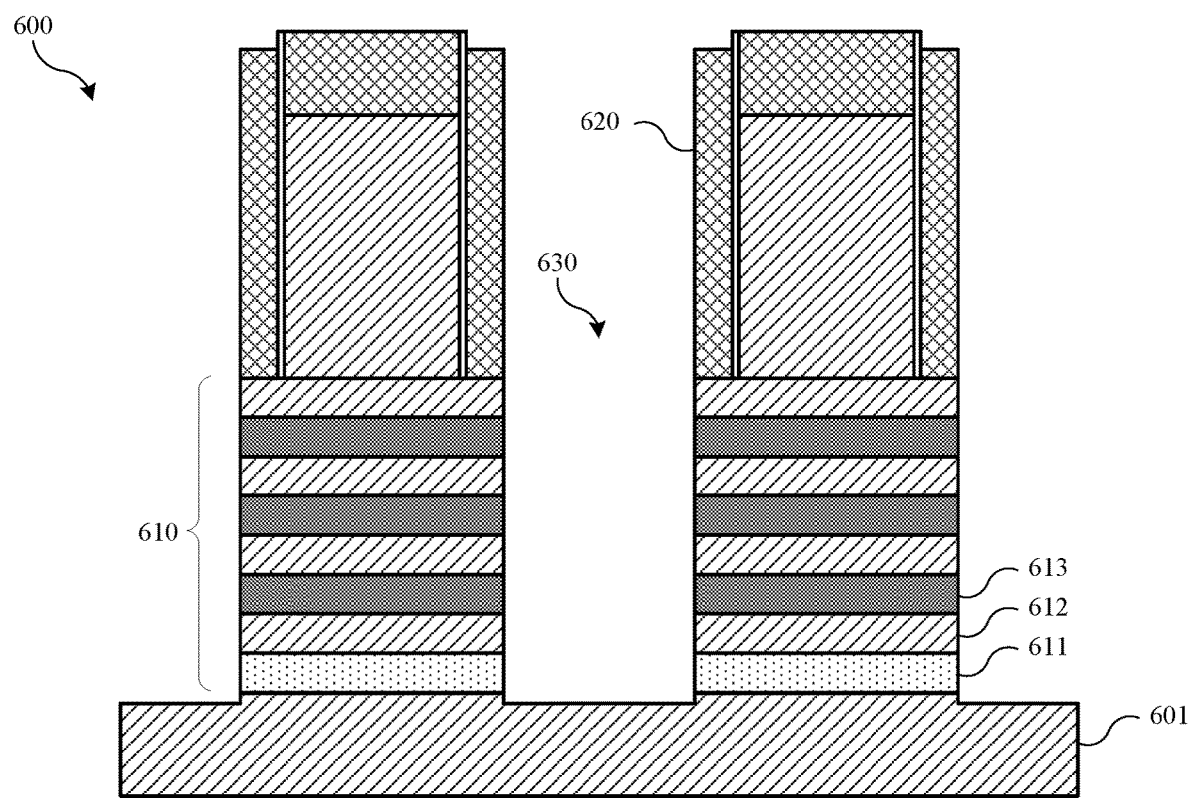

As illustrated in FIG. 6B, at operation 510, source or drain recesses 630 may be formed in exposed regions of the multi-layered structure 610. The recesses 630 may be formed via anisotropic etching to vertically remove the exposed first, second, and third silicon-containing materials 611, 612, 613 on either side of each gate formation structure 620. The etching or removal operation 510 may be selective towards the silicon-containing materials 611, 612, 613 relative to the cap material 622 and the dielectric material 623 overlying the dummy gate 621. Thus, the gate formation structures 620 may not be etched or removed at operation 510. The etching or removal operation 510 may optionally include an over-etch operation to ensure that the exposed first silicon-containing material 611 may be completely removed such that the substrate 601 may be exposed.

Figure 6C:
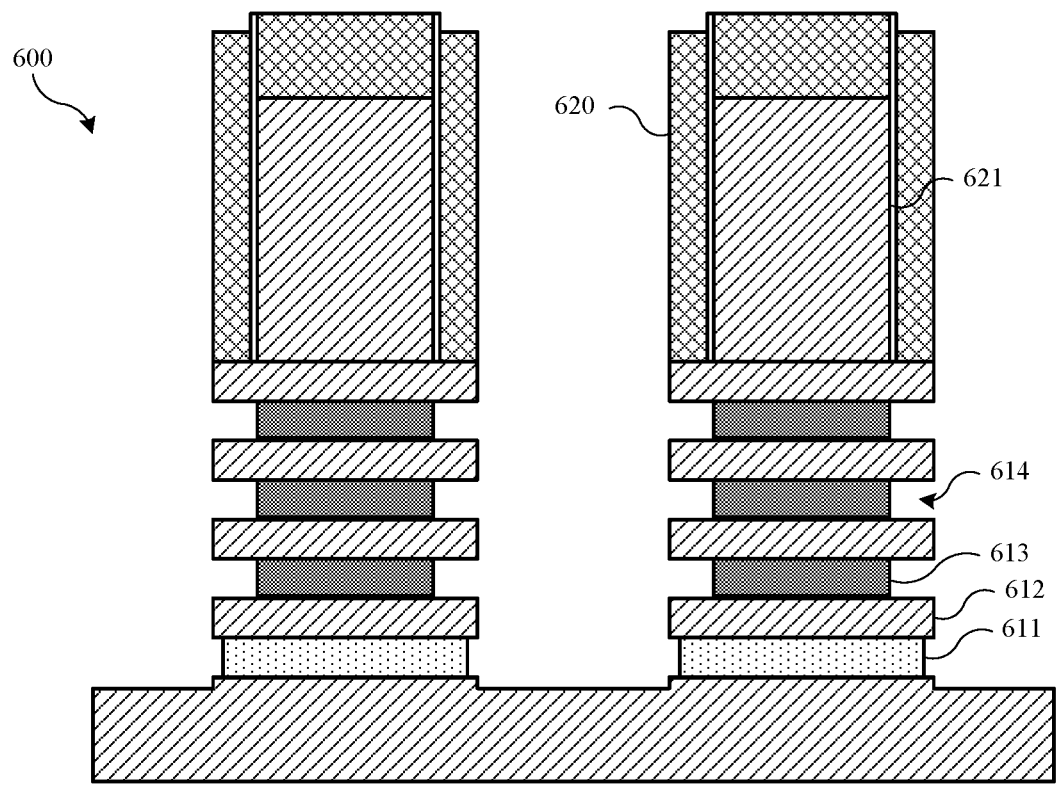

At operation 515, a lateral etching or recess operation may be performed on the third silicon-containing material 613 as illustrated in FIG. 6C. The lateral etch may be performed isotropically to remove third silicon-containing material 613 from both sides of the gate structures, such as on both sides of gate formation structures 620, and may not fully remove the third silicon-containing material 613. The lateral etch may be performed in chamber 200 as previously described, or in a different chamber capable of performing similar etch operations. The lateral etch may include forming a plasma of a fluorine-containing precursor in a remote plasma region of the processing chamber. The remote plasma region may be fluidly coupled with a processing region within which the structure 600 may be housed, although the processing region and the remote plasma region may be physically separated to limit plasma at the substrate level, which may damage exposed structures or materials. Effluents of the plasma may be flowed into the processing region, where they may contact the structure 600 to perform the lateral etch to form lateral recesses 614 between layers of the second silicon-containing material 612.

The recess 614 may be less than or about 10 nm in length in embodiments, and may be less than or about 8 nm, less than or about 6 nm, less than or about 4 nm, between about 3 nm and about 8 nm, or between about 5 nm and about 7 nm in embodiments. The lateral etch may maintain a certain amount of the third silicon-containing material 613 that may be located in vertical alignment with the dummy gate material 621, and may be characterized by dimensions similar to the dummy gate material 621, or slightly larger.

For example, the third silicon-containing material 613 may be maintained equivalent to a width of the dummy gate material 621, which may be greater than or about 10 nm, greater than or about 20 nm, greater than or about 30 nm, greater than or about 40 nm, greater than or about 50 nm, greater than or about 60 nm, greater than or about 70 nm, greater than or about 80 nm, greater than or about 90 nm, or more. Additionally, the width of the third silicon-containing material 613 may be slightly greater than the width of the dummy gate material 621, and may be up to or about 0.5 nm more on each side of the dummy gate material 621, and may be up to or about 1 nm more on each side, up to or about 2 nm more on each side, up to or about 3 nm more on each side, up to or about 4 nm more on each side, up to or about 5 nm more on each side, up to or about 6 nm more on each side, up to or about 7 nm more on each side, or more.

The lateral etch operation may selectively remove the third silicon-containing material 613, which may be silicon germanium, relative to the second silicon-containing material 612, which may be silicon. The operation may have a selectivity of the third silicon-containing material 613 relative to the second silicon-containing material 612 greater than or about 50:1, greater than or about 75:1, greater than or about 100:1, or greater in embodiments, which may allow recessing of the third silicon-containing material 613 while substantially maintaining or essentially maintaining the second silicon-containing material 612. In some embodiments, the second silicon-containing material 612 may be etched less than or about 1 nm during the lateral etch operation 515, and may be etched less than or about 0.8 nm, less than or about 0.6 nm, less than or about 0.4 nm, less than or about 0.2 nm, less than or about 0.1 nm, or less.

The lateral etch operation may also selectively remove the third silicon-containing material 613 relative to the first silicon-containing material 611. The first silicon-containing material 611 may also be silicon germanium. However, as discussed above, the first silicon-containing material 611 and the third silicon-containing material 613 may include different germanium contents. The first germanium content of the first silicon-containing material 611 may be less than the second germanium content of the third silicon-containing material 613, which may result in the first silicon-containing material 611 being etched at a slower rate than the third silicon-containing material 613.

In some embodiments, the lateral etch operation may have a selectivity of the third silicon-containing material 613 relative to the first silicon-containing material 611 similar to the selectivity of the third silicon-containing material 613 relative to the second silicon-containing material 612. Thus, the lateral etch operation may have a selectivity of the third silicon-containing material 613 relative to the first silicon-containing material 611 greater than or about 25:1, greater than or about 50:1, greater than or about 75:1, or greater in embodiments, which may allow recessing of the third silicon-containing material 613 while limiting recessing of the first silicon-containing material 611. In some embodiments, the first silicon-containing material 611 may be etched less than or about 3 nm during the lateral etch operation, and may be etched less than or about 2 nm, less than or about 1 nm, less than or about 0.8 nm, less than or about 0.6 nm, less than or about 0.4 nm, less than or about 0.2 nm, less than or about 0.1 nm, or less.

At optional operation 520, the structure 600 may be transferred from the etching chamber to a deposition chamber. The transfer may occur under vacuum, and the two chambers may both reside on the same cluster tool to allow the transfer to occur in a controlled environment. For example, vacuum conditions may be maintained during the transfer, and the transfer can occur without breaking vacuum.

Figure 6D:
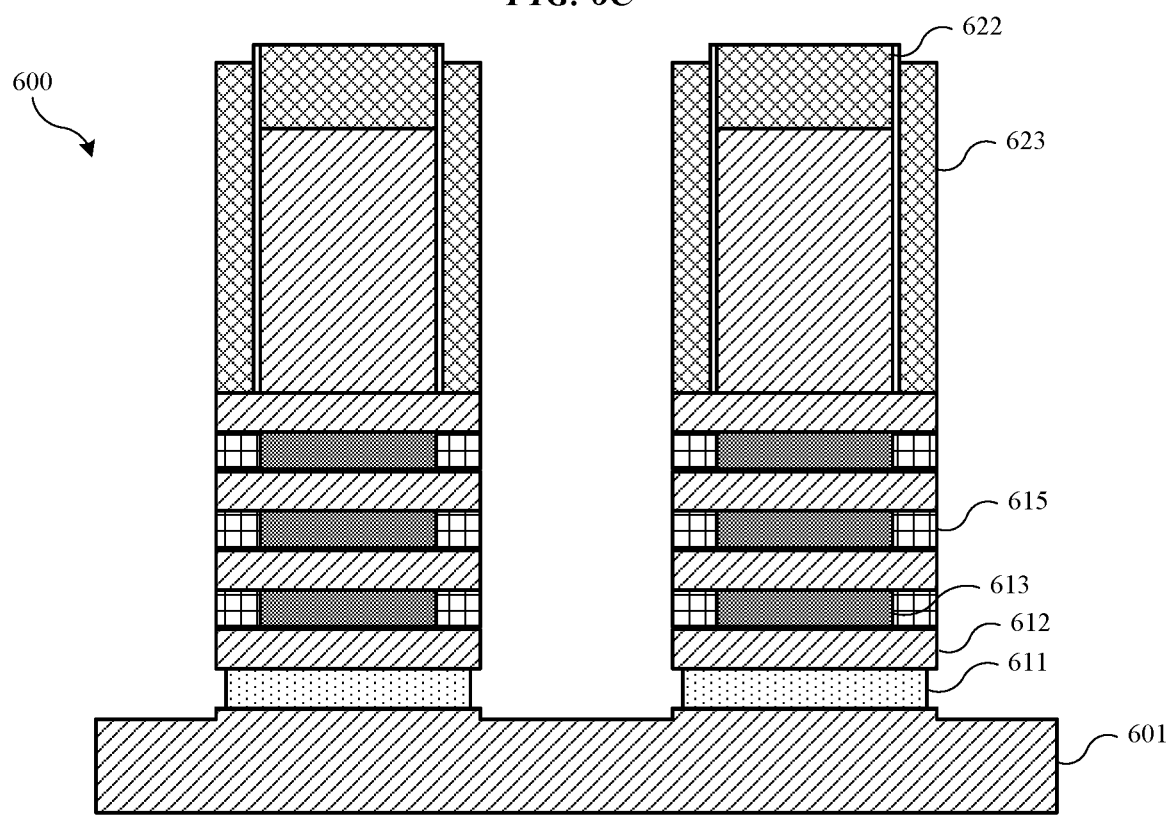

At operation 525, a spacer material 615 may be formed or deposited adjacent the recessed third silicon-containing material 613, as illustrated in FIG. 6D. Spacer material 615 may be a silicon-containing material in embodiments, and may be or include silicon nitride, silicon carbide, silicon oxycarbide, or low-k materials including carbon-doped silicon oxide, porous materials, or other materials characterized by a low dielectric constant. The spacer material 615 may be formed directly on or contacting the recessed third silicon-containing material 613. The spacer material 615 may be layered between and contacting regions of the second silicon-containing material 612 and may completely fill recesses 614 (shown in FIG. 6C). This lateral deposition may be a timed deposition to form the spacer material 615 within the recesses 614, while limiting formation on other exposed surfaces, such as exposed surfaces of the first silicon-containing material 611, the second silicon-containing material 612, the substrate 601, the cap material 622, and the dielectric material 623.

The deposition operation may be a selective deposition. Specifically, during the deposition operation, the spacer material 615 may be formed preferentially on the recessed third silicon-containing material 613 relative to the exposed first silicon-containing material 611, second silicon-containing material 612, substrate 601, cap material 622, and dielectric material 623. As noted above, because the first silicon-containing material 611 may include a lower or much lower germanium content as compared to the third silicon-containing material 613, the deposition selectivity towards the third silicon-containing material 613 relative to the first silicon-containing material 611 may be maintained, and substantially no or little spacer material 615 may be deposited on the first silicon-containing material 611 during the selective deposition.

Even if any deposition may occur on the first second silicon-containing material 611, the deposition may occur at a much faster rate on the third silicon-containing material 613, which may allow a subsequent etch to remove excess spacer material from the exterior of the first silicon-containing material 611. Specifically, in some embodiments, a slight etch back operation may be performed subsequent the selective deposition. For example, at optional operation 530, a subsequent dry etch may be performed to remove any spacer material that may be deposited on the other exposed surfaces, including the exposed surfaces of the first silicon-containing material. The selectivities of the etch may be any of those described herein to ensure that all other exposed materials are substantially maintained.

As opposed to conventional technologies that may include additional masking operations, the deposition operation 525 may be performed directly subsequent etching operation 515. By performing a selective etching and a selective deposition according to some embodiments of method 500, queue times may be substantially reduced over conventional technology that may require additional masking and removal techniques due to blanket deposition or formation of the spacer material 615. It is to be understood, however, that additional or alternative deposition and etching processes are similarly encompassed by the present technology.

Additionally, the deposition of the spacer material 615 may not involve any RIE operations. Conventional technologies may typically include blanket coating of a spacer material and an RIE operation following the blanket coating. When carbon-containing materials are utilized within the spacer material, the ashing performed with RIE may scavenge the carbon from the formed dielectric, which will increase the dielectric constant of the material, undermining the purpose of formation. By not performing an RIE subsequent deposition of the spacer material, the carbon-content of the spacer material may be preserved, which may maintain a lower dielectric constant of the material. Further, an RIE operation may have relatively low selectivity, and may etch sidewalls, underlying substrate, and other deposited materials. Such unintended etch may cause damage to other exposed surfaces, including but not limited to the exposed surfaces of the substrate 601 and the second silicon-containing material 612, which may adversely affect subsequent source or drain formation as will be discussed in more detail below.

Figure 6E:
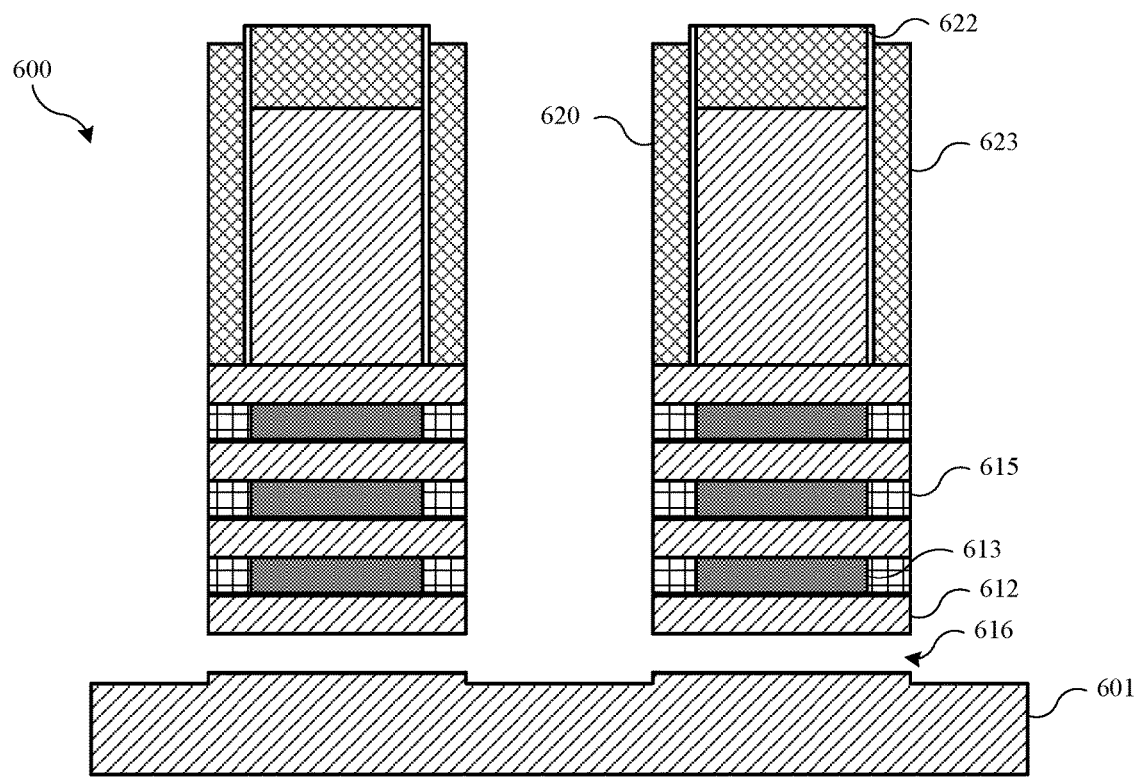

With reference to FIG. 6E, selective etching may be performed at operation 535 to laterally recess the first silicon-containing material 611 (shown in FIG. 6D) while maintaining other exposed materials, such as the substrate 601, the third silicon-containing material 613, the spacer material 615, the cap material 622, and the dielectric material 623. The etching operation may be performed until the entire layer of the first silicon-containing material 611 between the substrate 601 and a bottom layer of the second silicon-containing material 612 may be completely removed, forming a gap 616 between the substrate 601 and the bottom layer of the second silicon-containing material 612. Although not shown, the alternating layers of the second silicon-containing material 612 and the third silicon-containing material 613, including the spacer material 615, and the gate formation structures 620 may be supported by other transistor structures that may be formed over other regions of the substrate 601 when the first silicon-containing material 611 between the substrate 601 and the bottom layer of the second silicon-containing material 612 may be completely removed.

Figure 6F:
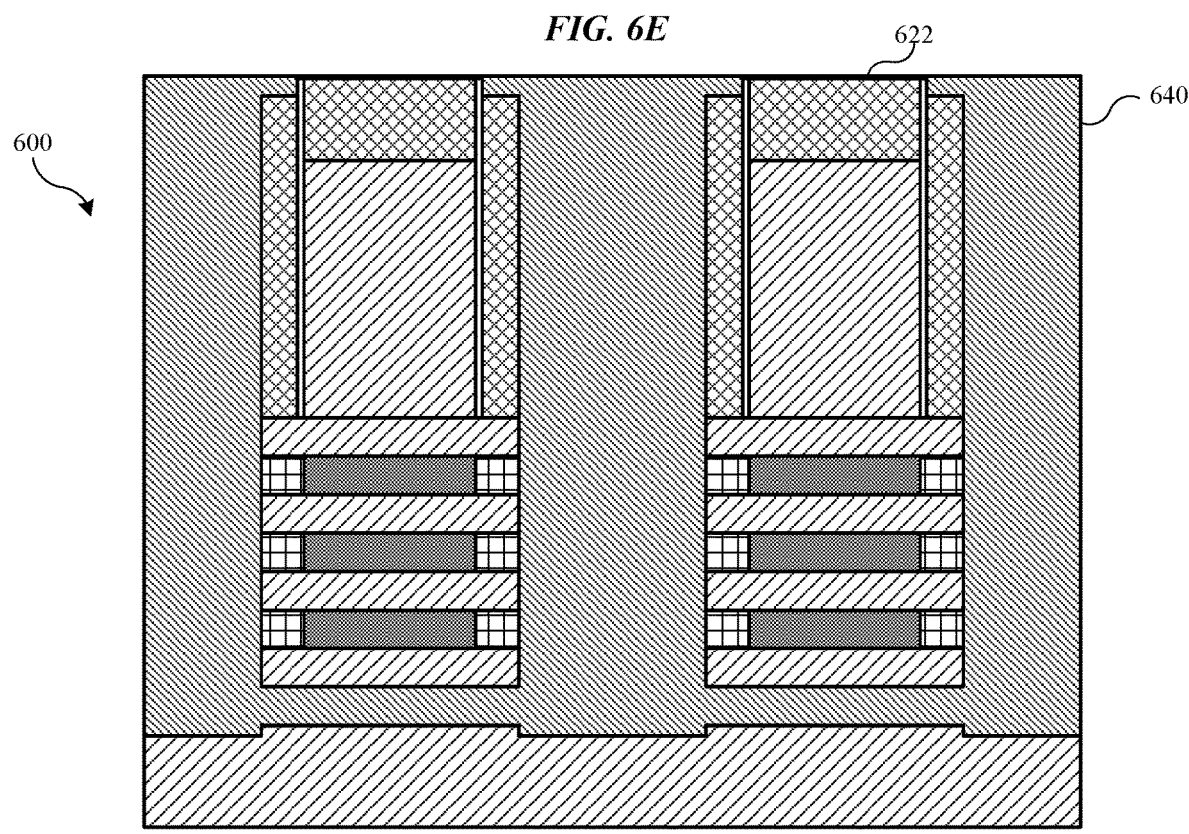
Figure 6G:
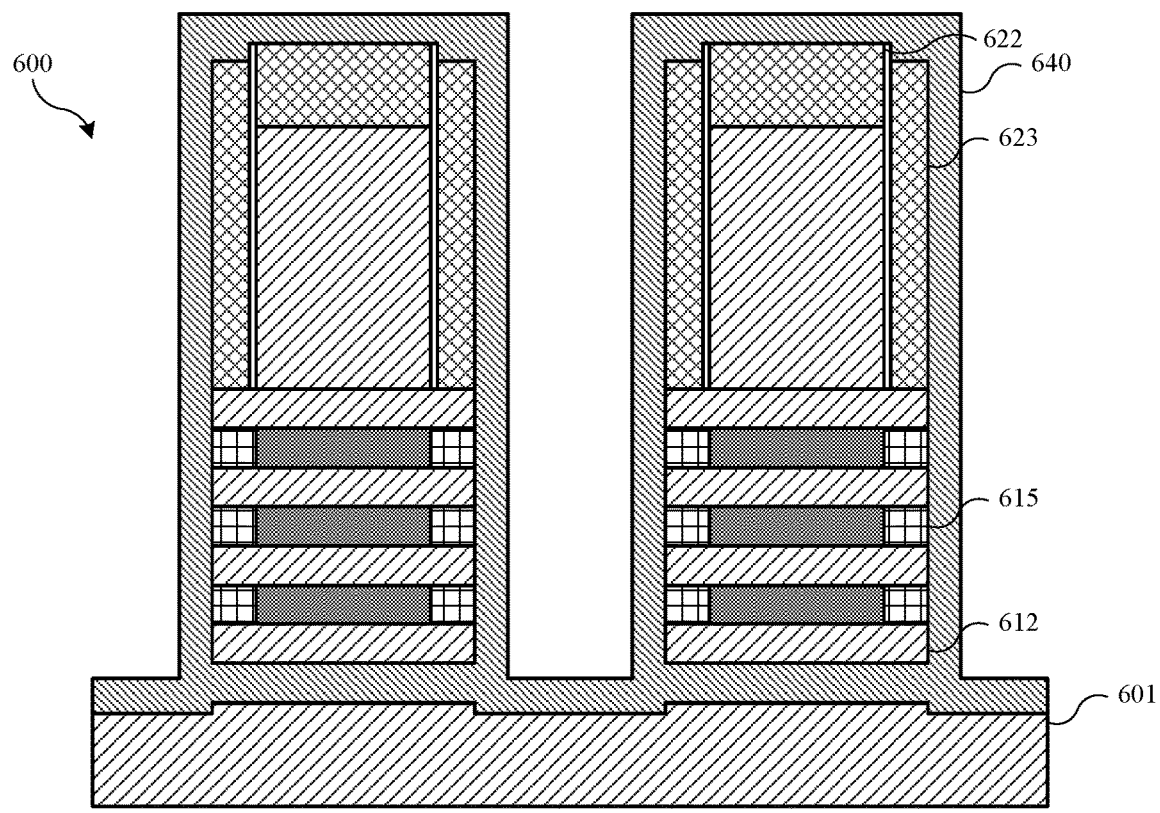

At operation 540, an insulation material 640, such as an oxide material, including but not limited to silicon oxide, may be deposited over the structure 600. The deposited insulation material 640 may fill the gap 616 created by removing the first silicon-containing material 611 (shown in FIG. 6D) during the preceding etching operation. To ensure a complete fill of the gap 616 (shown in FIG. 6E) with the insulation material 640, flowable deposition techniques may be utilized to deposit the insulation material 640 as shown in FIG. 6F in some embodiments. During flowable deposition, some of the insulation material 640 may be deposited inside the source or drain recesses 630 (shown in FIG. 6B) previously formed. Although FIG. 6F illustrates that the insulation material 640 may be deposited to the same height as the cap material 622 in some embodiments, the insulation material 640 may be deposited to any appropriate height, depending on the deposition parameters, although the gap 616 may be completely filled by the insulation material 640. In some embodiments, conformal deposition techniques, such as atomic layer deposition (ALD), may be utilized to deposit a conformal layer of the insulation material 640 as shown in FIG. 6G. The exemplary flowable or conformal deposition techniques described herein are for illustration purposes only and are not intended to be limiting, and any other suitable techniques may be utilized to deposit the insulation material 640 to fill the gap 616.

Figure 6H:
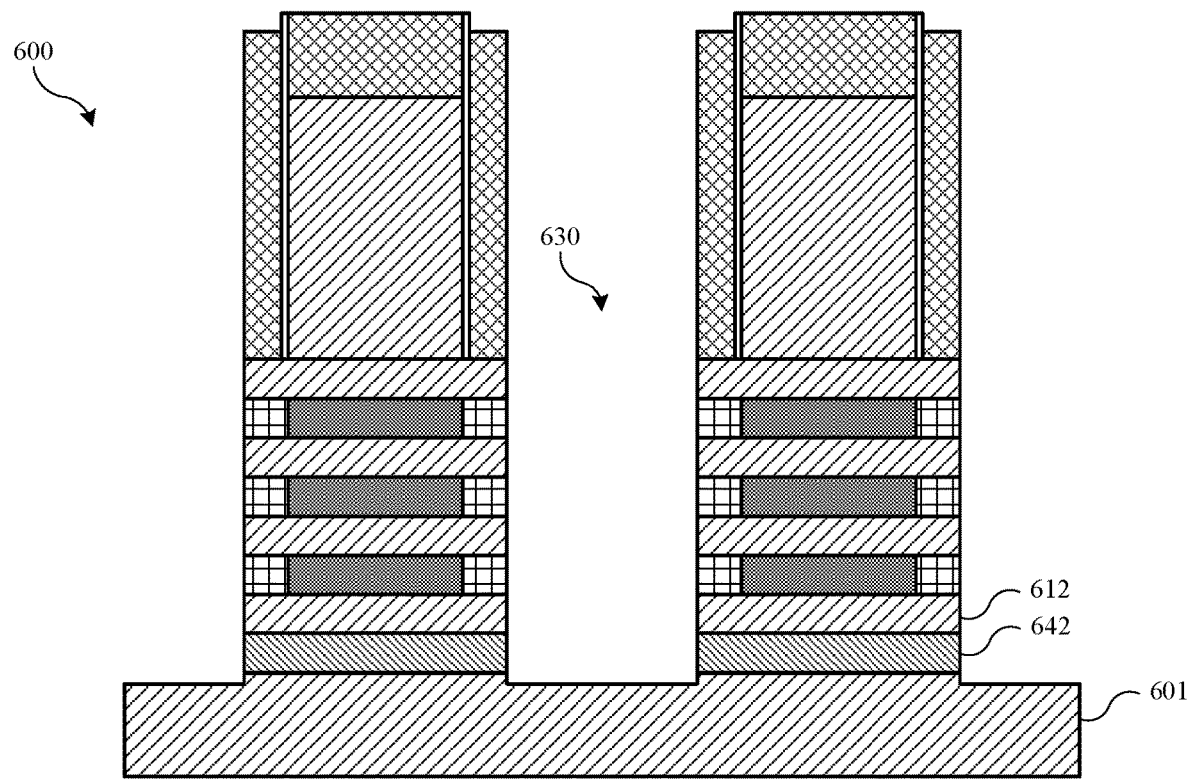

At operation 545, an etching operation may be performed to remove portions of the insulation material 640, leaving only the portion of the insulation material 640 between the substrate 601 and the bottom layer of the second silicon-containing material 612, which may also be referred to as a bottom insulation layer 642, as illustrated in FIG. 6H.

The etching may be selective towards the insulation material 640 relative to other materials that may be exposed, such as the substrate 601, the second silicon-containing material 612, the spacer material 615, the cap material 622, and the dielectric material 623, so as to ensure these other materials may not be etched. The etching may be isotropic or anisotropic. For example, when a conformal layer of the insulation material 640 may be deposited in the preceding operation, such as the conformal layer of the insulation material 640 shown in FIG. 6G, an isotropic etching may be performed to remove the insulation material 640 other than the portion forming the bottom insulation layer 642. To remove the insulation material 640 that may be deposited in the source or drain recesses during flowable deposition, such as the insulation material 640 in the source or drawn recesses shown in FIG. 6F, either an isotropic or an anisotropic etching may be utilized.

When forming the bottom insulation layer 642, RIE and/or ion implantation operations may not be utilized. An RIE or ion implantation operation may etch or damage structures that may be exposed, including but not limited to the exposed surfaces of the substrate 601 and layers of the second silicon-containing material 612. As will be discussed in more detail below, source or drain materials may be grown, e.g., epitaxially, over the exposed surface of the substrate 601 in the source or drain recesses 630. Damage to the exposed surface of the substrate 601 may hinder the growth of the source or drain materials and/or cause defects in the source or drain material grown. Additionally, the layers of the second silicon-containing material 612 may be processed or developed into nanowire transistor channels. Damage to the exposed surfaces of the layers of the second silicon-containing material 612 may adversely affect the contact or connection between the channels and the source or drain, which may adversely affect the overall device performance.

The formed bottom insulation layer 642 may be in vertical alignment with the layers of the second silicon-containing material 612. The bottom insulation layer 642 may have a width that may be no greater than, similar to, or substantially the same as a width of the layers of the second silicon-containing material 612, including the bottom layer of the second silicon-containing material 612. The width of the bottom insulation layer 642 may range from between about 10 nm and about 100 nm, between about 20 nm and about 80 nm, or between about 40 nm and about 60 nm, and may be greater than or about 10 nm, greater than or about 20 nm, greater than or about 30 nm, greater than or about 40 nm, greater than or about 50 nm, greater than or about 60 nm, greater than or about 70 nm, greater than or about 80 nm, greater than or about 90 nm, greater than or about 100 nm, or greater in various embodiments.

The bottom insulation layer 642 may have a thickness ranging between about 5 nm and about 25 nm or between about 10 nm and about 20 nm in embodiments. Depending on the dimensions of the other components of the transistor structure, the thickness of the bottom insulation layer 642 may be greater than or about 5 nm or greater than or about 10 nm, and may be less than or about 25 nm or less than or about 20 nm in various embodiments. In some embodiments a thickness of the bottom insulation layer 642 may be maintained above a certain threshold thickness so as to ensure adequate leakage control as will be discussed in more detail below. For example, in some embodiments the bottom insulation layer 642 may be maintained greater than or about 1 nm, and may be maintained greater than or about 2 nm, greater than or about 3 nm, or more. The thickness of the bottom insulation layer 642 may correspond to the vertical dimension of the gap 616 (shown in FIG. 6E) and the thickness of the layer of the first silicon-containing material 611 (shown in FIG. 6A) between the bottom layer of the second silicon-containing material 612 and the substrate 601. The thickness of the layer of the first silicon-containing material 611 may be selected such that the insulation material 640 forming the bottom insulation layer 642 may be easily deposited into the gap 616 and the excess of the insulation material 640 may be etched back easily to be below the bottom layer of the second silicon-contain material 612 without extending into the source or drain regions.

An aspect ratio of the width of the bottom insulation layer 642 to the thickness of the bottom insulation layer 642 may range between about 2:1 and about 20:1, between about 4:1 and about 16:1, or between about 8:1 and about 12:1, and may be at least about 2:1 , at least about 4:1, at least about 6:1, at least about 8:1, at least about 10:1, at least about 12:1, at least about 15:1, or at least about 20:1, or greater in various embodiments.

A ratio of the thickness of the bottom insulation layer 642 to a thickness of each layer of the second silicon containing material may range between 4:1 and about 1:5 in embodiments, and may range between about 4:1 and 1:4, between about 3:1 and 1:3, or between about 2:1 and 1:2. A ratio of the thickness of the bottom insulation layer 642 to a thickness of each layer of the third silicon-containing material 613 may range between 4:1 and about 1:5 in embodiments, and may range between about 4:1 and 1:4, between about 3:1 and 1:3, or between about 2:1 and 1:2.

Figure 6I:
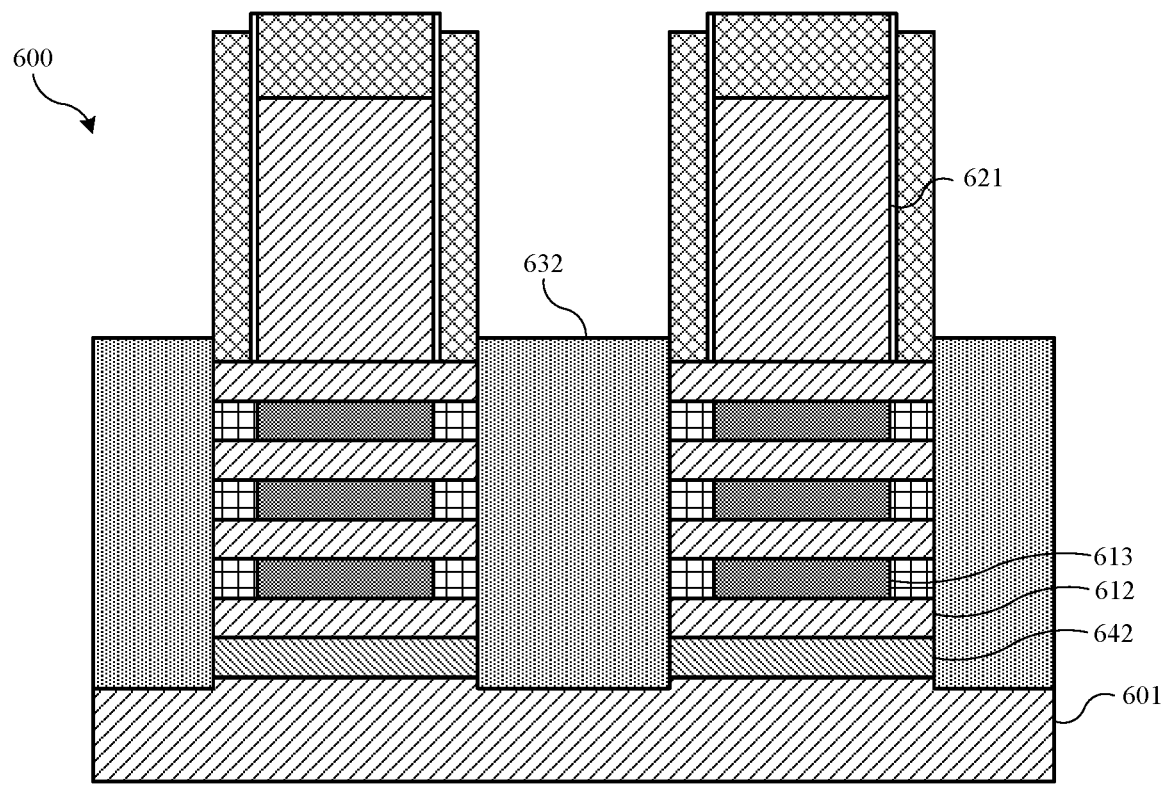

As illustrated in FIG. 6I, a source and drain for the transistor structures may be formed by depositing a source or drain material 632 in the source or drain recesses at operation 550. Depending on the type of the transistor structures, e.g., transistor structures having p-type or n-type channels, the source or drain material 632 may differ. In some embodiments, the source or drain material 632 may include silicon, such as phosphorous doped silicon, silicon germanium, such as boron doped silicon germanium, and the like. Although the source or drain material 632 may differ, the different source or drain materials 632 may be grown in a similarly manner. In some embodiments, the source or drain material 632 may be epitaxially grown. For example, the source or drain material 632 may be epitaxially grown on the exposed surface of the substrate 601 which may include crystal silicon.

As already mentioned above, method 500 may not include any RIE and/or ion implantation operation. Thus, damage associated with an RIE and/or ion implantation operation to the substrate 601 and the layers of the second silicon-containing material 612 as discussed above may be avoided. Consequently, the epitaxial growth of the source or drain material 632 may be facilitated, and the sources or drains, as well as the contact or connection between the sources or drains and the nanowire channels developed from the layers of the second silicon-containing material, may include little or no defects.

In some embodiments, a dry cleaning operation may be performed to remove any native oxide that may be formed on the exposed surfaces prior to epitaxially growing the source or drain material 632. The dry cleaning operation may include exposing the structure 600 to a cleaning precursor containing hydrogen fluoride. Because the cleaning operation may be performed for a short duration to remove the native oxide, the removal, if any, of the bottom insulation layer 642 by the cleaning operation may be negligible. Further, if any removal of the bottom insulation layer 642 by the cleaning operation may occur, the removal may be limited to the side surfaces of the bottom insulation layer 642, and the removal or lateral recess of the bottom insulation layer 642 may be less than 1 nm, less than 0.8 nm, less than 0.6 nm, less than 0.4 nm, less than 0.2 nm, less than 0.1 nm, or less. Such removal or lateral recess may not affect the ability of the bottom insulation layer 642 to prevent current leakage that may occur through the bottom nanowire channel as will be discussed in more detail below.

Figure 6J:
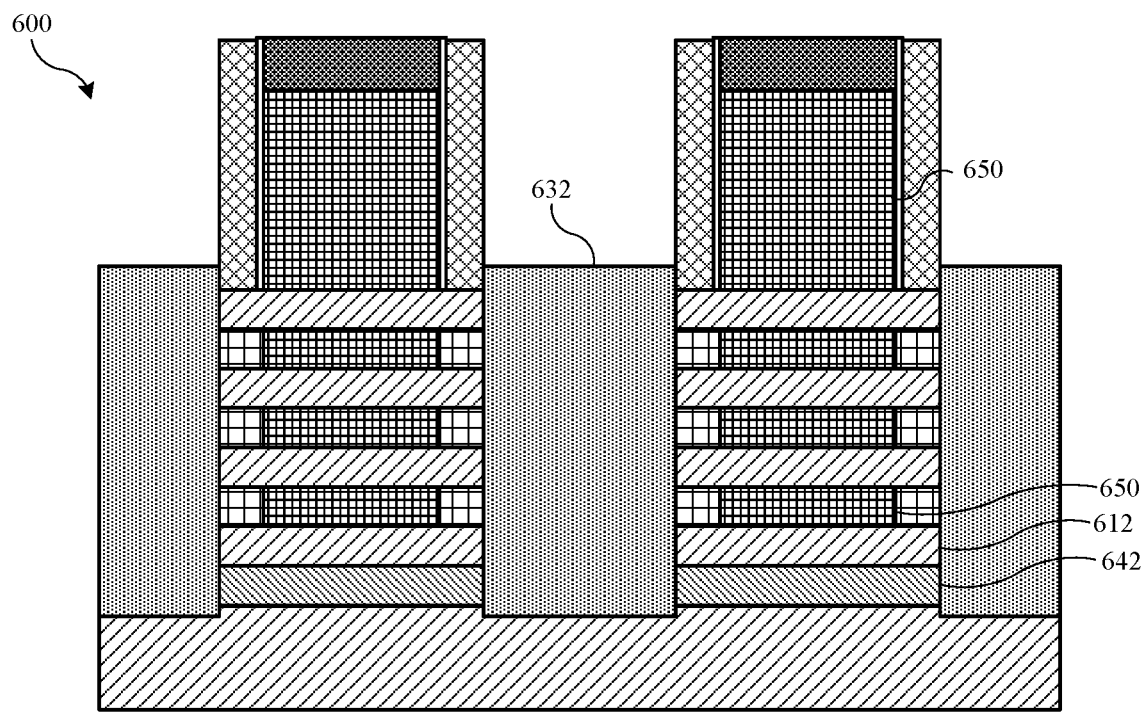

At operation 555, the layers of the third silicon-containing material 613 and the dummy gate 621 (shown in, e.g., FIG. 6I) may be removed, and a gate material 650, such as a metal, may be deposited above and/or below the layers of the second silicon-containing material 612 as illustrated in FIG. 6J. The layers of the second silicon-containing material 612 may form the nanowire channels for the transistor structures and may be controlled by the gates formed by the gate material 650. Although FIG. 6J illustrates that the gate material 650 may be deposited above and/or below the nanowire channels formed by the layers of the second silicon-containing material 612, the gate material 650 may be deposited all around the nanowire channels in some embodiments to form gate-all-around transistors.

There are several advantages of method 500 and the transistor structures formed using method 500. For example, the bottom insulation layer may be formed using method 500 described herein to provide effective leakage control without adversely affecting the source or drain formation for the transistor structures. Specifically, as shown in FIG. 6J, not all nanowire channels may be controlled by an all-around gate. For example, the bottom channel formed by the bottom layer of the second silicon-containing material 612 may have only the top portion of the gate and may not have the bottom portion of the gate. Thus, as compared to the other nanowire channels controlled by an all-around gate, the bottom nanowire channel may have less leakage control as provided by the gate alone. By forming the bottom insulation layer below the bottom nanowire channel opposite to the gate, leakage through the bottom nanowire channel may be substantially prevented.

Additionally, the bottom insulation layer as described herein may be formed exclusively under the bottom nanowire channel, and may not extend into the source or drain regions. In other words, the bottom insulation layer may have a width that may not be greater than or may be similar to or substantially the same as a width of the nanowire channels, including the bottom nanowire channel. With this configuration, the bottom insulation layer may not affect or interfere with the growth of the source or drain material over the silicon substrate. In contrast, some conventional technologies provide a bottom insulation layer under the source and drain of the transistor structure. However, it may be difficult to epitaxially grow the source or drain material on an insulation material. With the bottom insulation layer described herein, the source or drain material may be formed more easily, such as by epitaxial growth on the silicon substrate.

Further, the process described herein may not utilize an RIE and/or ion implantation operation which may be utilized in many conventional technologies. The damage to the surfaces on which the source or drain material may be grown or the surfaces with which the source or drain may form contact may be, if any, significantly less as compared to the damage that may be otherwise caused by an RIE and/or ion implantation operation. Consequently, significantly less defects may be formed in the source or drain using the method described herein as compared to conventional technologies.

The etching operations described herein may involve additional precursors along with particular fluorine-containing precursors. Nitrogen trifluoride may be utilized to generate plasma effluents in some embodiments. Additional or alternative fluorine-containing precursors may also be utilized. For example, a fluorine-containing precursor may be flowed into the remote plasma region and the fluorine-containing precursor may include at least one precursor selected from the group consisting of atomic fluorine, diatomic fluorine, carbon tetrafluoride, bromine trifluoride, chlorine trifluoride, nitrogen trifluoride, hydrogen fluoride, sulfur hexafluoride, and xenon difluoride. The remote plasma region may be within a distinct module from the processing chamber or a compartment within the processing chamber. As illustrated in FIG. 2, both RPS unit 201 and first plasma region 215 may be utilized as the remote plasma region. An RPS may allow dissociation of plasma effluents without damage to other chamber components, while first plasma region 215 may provide a shorter path length to the substrate during which recombination may occur. Additional precursors may also be delivered to the remote plasma region to augment the fluorine-containing precursor, such as other carbon-containing precursors, hydrogen-containing precursors, or oxygen-containing precursors.

The etching operations may be performed below about 10 Torr in embodiments, and may be performed below or about 5 Torr in embodiments. The process may also be performed at a temperature below about 100° C. in embodiments, and may be performed below about 50° C. As performed in chamber 200, or a variation on this chamber, or in a different chamber capable of performing similar operations, the process may remove portions of the third silicon-containing material 613 selective to the substrate 601, the first silicon-containing material 611, the second silicon-containing material 612, the cap material 622, and the dielectric material 623. Further, the process may remove the first silicon-containing material 611 selectively to the substrate 601, the second silicon-containing material 612, the cap material 622, and the dielectric material 623.

The etch selectivity of the third silicon-containing material 613 relative to other components exposed on the surface of the substrate, including the layer of the second silicon-containing material 612, when the present methods are performed may be greater than or about 10:1, greater than or about 20:1, greater than or about 50:1, or greater than or about 100:1, or more, for a variety of materials formed on the substrate, and which may be exposed to plasma effluents. Accordingly, depending on the feature sizes, the third silicon-containing material 613 may be removed from the surface of the substrate while the other exposed materials may be reduced by less than 1 nm. For example, the feature width from one gate section to a second gate section may be between about 50 nm and about 70 nm, and may extend down to between about 20 nm and about 30 nm. The depth of the lateral recess for the third silicon-containing material 613 may be less than or about 50 nm, and may be less than or about 40 nm, less than or about 30 nm, less than or about 20 nm, less than or about 10 nm, or less in embodiments as noted above. Because of this depth of etching, a minimal amount of other exposed materials may be removed, which may be less than or about 3 nm, less than or about 1 nm, less than or about 0.5 nm, or the materials may be substantially or essentially maintained. Accordingly, the third silicon-containing material 613 etch relative to the other exposed materials may be characterized by any of the selectivities discussed above for the materials that may be utilized for each structure.

The etch selectivity of the first silicon-containing material 611 relative to other components exposed on the surface of the substrate when the present methods are performed may be greater than or about 10:1, greater than or about 20:1, greater than or about 50:1, or greater than or about 100:1, or more, for a variety of materials formed on the substrate, and which may be exposed to plasma effluents. Accordingly, depending on the feature sizes, the first silicon-containing material 611 may be removed from the surface of the substrate while the other exposed materials may be reduced by less than 1 nm. For example, the first silicon-containing material 611 may be completely removed, creating the gap for subsequent bottom insulation formation, while a minimal amount of other exposed materials may be removed, which may be less than or about 3 nm, less than or about 1 nm, less than or about 0.5 nm, or the materials may be substantially or essentially maintained. Accordingly, the first silicon-containing material 611 etch relative to the other exposed materials may be characterized by any of the selectivities discussed above for the materials that may be utilized for each structure.

By performing method 500 described herein, a bottom insulation layer, such as bottom insulation layer 642, may be formed to effectively prevent leakage through a bottom nanowire channel that may otherwise occur due to the lack of a bottom gate portion, such as the bottom gate portion in a gate-all-around transistor structure. Additionally, the bottom insulation layer may be formed without utilizing any RIE and//or ion implantation processes, which may prevent damage that may otherwise be caused by an RIE and/or ion implantation operation to the silicon substrate on which the source or drain material may be epitaxially grown. Further, by avoiding RIE processes, the spacer material may be better maintained and the low-k of the spacer material may be preserved. The method may further reduce queue times by hours by removing many patterning and removal operations that may be performed prior to, during, or subsequent to formation in conventional processes.

In the preceding description, for the purposes of explanation, numerous details have been set forth in order to provide an understanding of various embodiments of the present technology. It will be apparent to one skilled in the art, however, that certain embodiments may be practiced without some of these details, or with additional details.

Having disclosed several embodiments, it will be recognized by those of skill in the art that various modifications, alternative constructions, and equivalents may be used without departing from the spirit of the embodiments. Additionally, a number of well-known processes and elements have not been described in order to avoid unnecessarily obscuring the present technology. Accordingly, the above description should not be taken as limiting the scope of the technology.

Where a range of values is provided, it is understood that each intervening value, to the smallest fraction of the unit of the lower limit, unless the context clearly dictates otherwise, between the upper and lower limits of that range is also specifically disclosed. Any narrower range between any stated values or unstated intervening values in a stated range and any other stated or intervening value in that stated range is encompassed. The upper and lower limits of those smaller ranges may independently be included or excluded in the range, and each range where either, neither, or both limits are included in the smaller ranges is also encompassed within the technology, subject to any specifically excluded limit in the stated range. Where the stated range includes one or both of the limits, ranges excluding either or both of those included limits are also included.

As used herein and in the appended claims, the singular forms "a", "an", and "the" include plural references unless the context clearly dictates otherwise. Thus, for example, reference to "a layer" includes a plurality of such layers, and reference to "the precursor" includes reference to one or more precursors and equivalents thereof known to those skilled in the art, and so forth.

Also, the words "comprise(s)", "comprising", "contain(s)", "containing", "include(s)", and "including", when used in this specification and in the following claims, are intended to specify the presence of stated features, integers, components, or operations, but they do not preclude the presence or addition of one or more other features, integers, components, operations, acts, or groups.

The invention claimed is:

1. A method of forming a semiconductor structure, the method comprising:
    forming a plasma of a fluorine-containing precursor in a remote plasma region of a processing chamber;
    contacting a semiconductor substrate with effluents of the plasma, wherein the semiconductor substrate is housed in a processing region of the processing chamber, wherein the semiconductor substrate includes a layer of a first silicon-containing material having a first germanium content formed over the semiconductor substrate, wherein the semiconductor substrate further includes alternating layers of a second silicon-containing material and a third silicon-containing material over the layer of the first silicon-containing material, and wherein the third silicon-containing material has a second germanium content;
    laterally recessing the layers of the third silicon-containing material, wherein the layers of the third silicon-containing material are selectively recessed relative to the layer of the first silicon-containing material and relative to the layers of the second silicon-containing material;
    depositing a spacer material adjacent to the layers of the third silicon-containing material;
    etching the layer of the first silicon-containing material, wherein the layer of the first silicon-containing material is selectively etched relative to the layers of the second silicon-containing material and the spacer material;
    depositing an insulation material between the semiconductor substrate and the alternating layers of the second silicon-containing material and the third silicon-containing material;
    etching the insulation material to form a bottom insulation layer between the substrate and a bottom layer of the alternating layers of the second silicon-containing material and the third silicon-containing material; and
    depositing a source or drain material over exposed surfaces of the semiconductor substrate, wherein the source or drain material is adjacent to the bottom insulation layer and the alternating layers of the second silicon-containing material and the third silicon-containing material.

2. The method of claim 1, wherein the first germanium content is less than the second germanium content.

3. The method of claim 1, wherein a ratio of the second germanium content to the first germanium content ranges between about 1:1 and about 100:1.

4. The method of claim 1, wherein etching the layer of the first silicon-containing material completely removes the layer of the first silicon-containing material between the semiconductor substrate and the alternating layers of the second silicon-containing material and the third silicon-containing material.

5. The method of claim 1, wherein the insulation material comprises an oxide material.

6. The method of claim 1,
    wherein the bottom insulation layer has a width no greater than a width of the bottom layer of the alternating layers.

7. The method of claim 6, wherein the bottom insulation layer has a width-to-thickness aspect ratio ranging between about 2:1 and 20:1.

8. The method of claim 1, wherein the method is performed without conducting an ion implantation operation.

9. The method of claim 1, wherein the first silicon-containing material comprises silicon germanium, wherein the second silicon-containing material comprises silicon, and wherein the third silicon-containing material comprises silicon germanium.

10. The method of claim 1, further comprising:
   removing the layers of the third silicon-containing material; and
   forming layers of a metal material, wherein the layers of the metal material and the layers of the second silicon-containing material are arranged in an alternating manner.

11. The method of claim 10, wherein the layers of the second silicon-containing material are developed into a plurality of nanowire channels, and wherein the layers of the metal material are developed into a plurality of gates configured to control the plurality of nanowire channels.

12. The method of claim 1, wherein the semiconductor substrate further comprises a plurality of gate formation structures each having an exposed cap material and an exposed dielectric material, wherein:
   the layers of the third silicon-containing material are selectively recessed relative to the exposed cap material and the exposed dielectric material;
   the spacer material is selectively deposited relative to the exposed cap material and the exposed dielectric material; and
   the layer of the first silicon-containing material is selectively etched relative to the exposed cap material and the exposed dielectric material.

* * * * *